United States Patent
Jun et al.

(10) Patent No.: US 7,844,875 B2
(45) Date of Patent: Nov. 30, 2010

(54) PROGRAMMABLE TEST CLOCK GENERATION RESPONSIVE TO CLOCK SIGNAL CHARACTERIZATION

(75) Inventors: Hong-Shin Jun, San Jose, CA (US);
Zhiyuan Wang, Fremont, CA (US);
Xinli Gu, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 286 days.

(21) Appl. No.: 12/013,458

(22) Filed: Jan. 13, 2008

(65) Prior Publication Data

US 2009/0183046 A1    Jul. 16, 2009

(51) Int. Cl.
*G01R 31/28* (2006.01)
*G11B 20/20* (2006.01)
(52) U.S. Cl. ...................... 714/744; 714/700
(58) Field of Classification Search ............. 714/700, 714/744

See application file for complete search history.

(56) References Cited

U.S. PATENT DOCUMENTS

| | | | | |
|---|---|---|---|---|
| 5,990,713 | A * | 11/1999 | Zepp | 327/141 |
| 6,326,812 | B1 * | 12/2001 | Jefferson | 326/93 |
| 6,356,122 | B2 * | 3/2002 | Sevalia et al. | 327/105 |
| 6,888,385 | B2 * | 5/2005 | Bajaj et al. | 327/147 |
| 7,024,324 | B2 * | 4/2006 | Rifani et al. | 702/79 |
| 7,050,080 | B2 * | 5/2006 | Ema et al. | 347/235 |
| 7,062,688 | B2 * | 6/2006 | Gauthier et al. | 714/712 |
| 7,073,098 | B2 * | 7/2006 | Kozaki | 714/700 |
| 7,352,165 | B2 * | 4/2008 | Loke et al. | 324/76.53 |
| 7,536,617 | B2 * | 5/2009 | Jun et al. | 714/731 |
| 2006/0242474 | A1 | 10/2006 | Jun et al. | |

OTHER PUBLICATIONS

Franch et al., "On-chip Timing Uncertainty Measurements on IBM Microprocessors," IEEE International Test Conference, Paper 1.1, 2007, USA, pp. 1-7.
Rearick et al., "Calibrating Clock Stretch During AC Scan Testing," IEEE International Test Conference, Paper 11.3, 2005, USA, pp. 1-8.

* cited by examiner

*Primary Examiner*—James C Kerveros
(74) *Attorney, Agent, or Firm*—The Law Office of Kirk D. Williams

(57) ABSTRACT

A clock signal within an application-specific integrated circuit (ASIC) is characterized while operating a subsystem. Subsequently, also on the ASIC, a testing clock signal is generated, based on the characterization of the operative clock signal, for purposes of testing the subsystem operating according to the testing clock signal instead of the clock signal. The ASIC includes a clock signal characterization circuit configured to characterize a clock signal within the ASIC; a programmable testing clock signal generator configured for being programmed based on said characterization of the clock signal, and for generating a test clock signal based on its said programming; and the subsystem tested when operating according to the testing clock signal instead of the clock signal.

19 Claims, 7 Drawing Sheets

PROGRAMMABLE TEST CLOCK GENERATION RESPONSIVE TO CLOCK SIGNAL CHARACTERIZATION

TECHNICAL FIELD

The present disclosure relates generally to the testing of application-specific integrated circuits (ASICs), such as those used in communications and computer systems, especially routers, packet switching systems, and other network devices.

BACKGROUND

Investigating faults in semiconductor devices is a critical aspect of the manufacturing and maintenance process. As the geometries of semiconductor devices are getting smaller, failures caused by defects in the manufacturing process and design margins are becoming increasingly common. Exemplary failures include those caused by timing-related at-speed faults.

Note, nothing described or referenced in this document is admitted as prior art to this application unless explicitly so stated.

BRIEF DESCRIPTION OF THE DRAWINGS

The appended claims set forth the features of the invention with particularity. The invention, together with its advantages, may be best understood from the following detailed description taken in conjunction with the accompanying drawings of which:

DESCRIPTION OF EXAMPLE EMBODIMENTS

1. Overview

Figure 1:
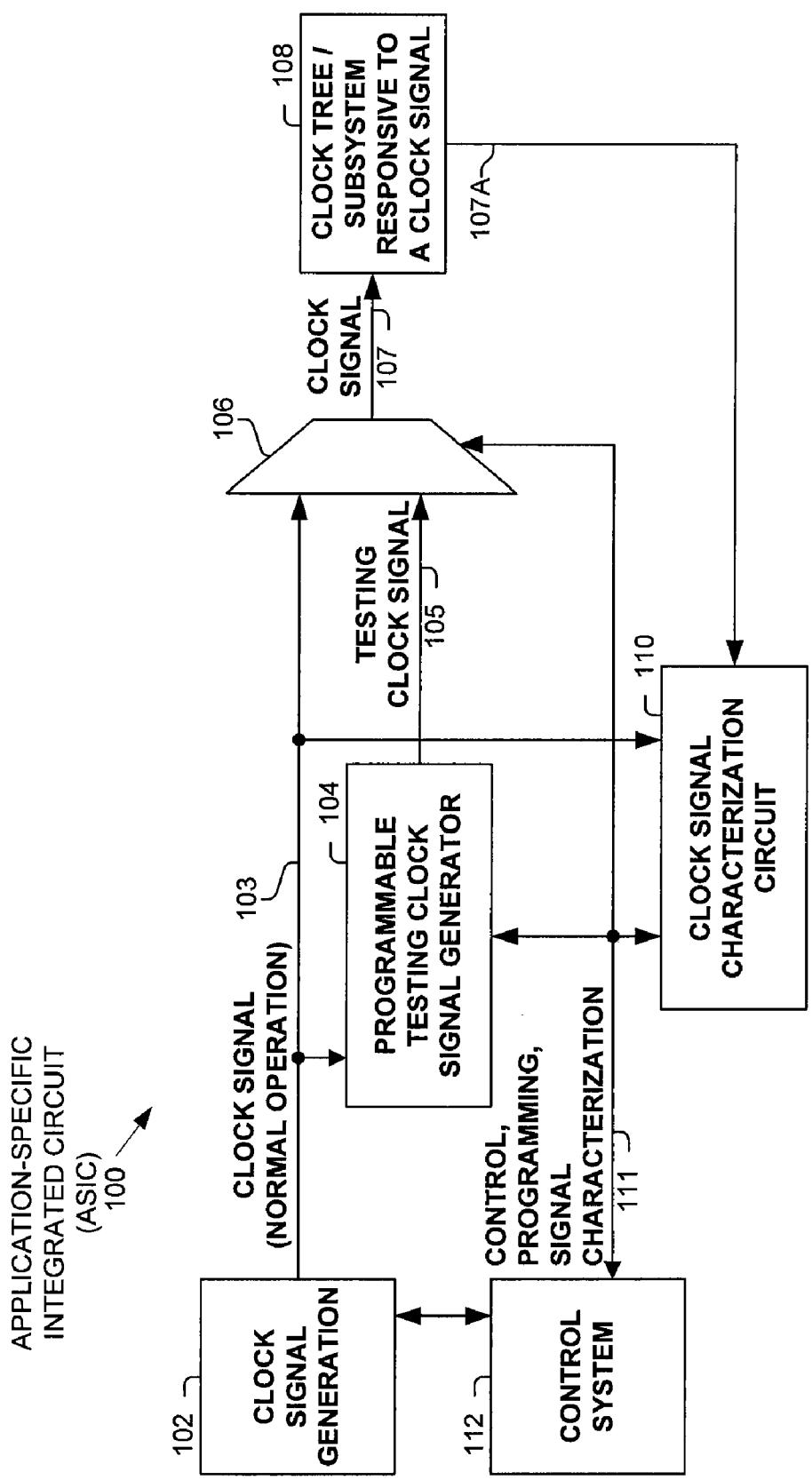
FIG. 1 illustrates a portion of an ASIC according to one embodiment.

Disclosed are, inter alia, methods, apparatus, mechanisms, and means for characterizing a clock signal within an application-specific integrated circuit (ASIC), and then, also on the ASIC, generating a testing clock signal based on the characterization of the operative clock signal for testing purposes.

One embodiment includes an application-specific integrated circuit (ASIC), comprising: a clock signal characterization circuit configured to characterize a clock signal within the ASIC; and a programmable testing clock signal generator configured for being programmed based on said characterization of the clock signal, and for generating a test clock signal based on its said programming.

In one embodiment, the clock signal characterization circuit is configured to characterize the clock signal during operation of a subsystem responsive to the clock signal; and wherein the programmable testing clock signal generator is configured to generate the test clock signal for testing the subsystem. In one embodiment, the clock signal characterization circuit is configured to also characterize the test clock signal. In one embodiment, the programmable testing clock signal generator is configured to be modified based on said characterization of the test clock signal should it differ from said characterization of the clock signal. In one embodiment, the characterization of the test clock signal matches the characterization of the clock signal.

In one embodiment, the clock signal characterization circuit includes a plurality of devices configured to sample one or more input clock signals at different timing offsets, with the one or more input clock signals including the clock signal. In one embodiment, the one or more input clock signals include the test clock signal. In one embodiment, each of the plurality of devices is configured to recognize a low or a high signal value of one of said input clock signals; and the programmable testing clock signal generator is configured to be programmed with said low or high signal values recognized by the plurality of devices. One embodiment includes a delay chain for generating signals at said different timing offsets; and the plurality of devices are configured to be responsive to the generated signals at the different timing offsets. In one embodiment, the programmable testing clock signal generator is configured to be responsive to the generated signals at the different timing offsets for the generation of the test clock signal based on its programming.

2. Description

Disclosed are, inter alia, methods, apparatus, mechanisms, and means for characterizing a clock signal within an application-specific integrated circuit (ASIC), and then, also on the ASIC, generating a testing clock signal based on the characterization of the operative clock signal for testing purposes.

Embodiments described herein include various elements and limitations, with no one element or limitation contemplated as being a critical element or limitation. Each of the claims individually recites an aspect of the invention in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. The embodiments described hereinafter embody various aspects and configurations within the scope and spirit of the invention, with the figures illustrating exemplary and non-limiting configurations. Note, computer-readable media and means for performing methods and processing block operations are disclosed and are in keeping with the extensible scope and spirit of the invention.

Note, the steps, connections, and processing of signals and information illustrated in the figures, including, but not limited to any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation).

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc. are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps.

Disclosed are, inter alia, methods, apparatus, mechanisms, and means for characterizing a operative clock signal within an application-specific integrated circuit (ASIC), and then, also on the ASIC, generating a testing clock signal based on the characterization of the operative clock signal for testing purposes. One embodiment includes an application-specific integrated circuit (ASIC), comprising: a clock signal characterization circuit configured to characterize a clock signal within the ASIC; and a programmable testing clock signal generator configured for being programmed based on said characterization of the clock signal, and for generating a test clock signal based on its said programming.

In one embodiment, the clock signal characterization circuit is configured to characterize the clock signal during operation of a subsystem responsive to the clock signal; and wherein the programmable testing clock signal generator is configured to generate the test clock signal for testing the subsystem. In one embodiment, the clock signal characterization circuit is configured to also characterize the test clock signal. In one embodiment, the programmable testing clock signal generator is configured to be modified based on said characterization of the test clock signal should it differ from said characterization of the clock signal. In one embodiment, the characterization of the test clock signal matches the characterization of the clock signal.

In one embodiment, the clock signal characterization circuit includes a plurality of devices configured to sample one or more input clock signals at different timing offsets, with the one or more input clock signals including the clock signal. In one embodiment, the one or more input clock signals include the test clock signal. In one embodiment, each of the plurality of devices is configured to recognize a low or a high signal value of one of said input clock signals; and the programmable testing clock signal generator is configured to be programmed with said low or high signal values recognized by the plurality of devices. One embodiment includes a delay chain for generating signals at said different timing offsets; and the plurality of devices are configured to be responsive to the generated signals at the different timing offsets. In one embodiment, the programmable testing clock signal generator is configured to be responsive to the generated signals at the different timing offsets for the generation of the test clock signal based on its programming.

One embodiment includes a method, comprising: characterizing a clock signal at a position within an application-specific integrated circuit (ASIC) by a clock signal characterization circuit located within the ASIC to generate one or more values representing said characterized clock signal during the operation of a subsystem located on the ASIC; programming a programmable testing clock signal generator, located on the ASIC, based on said one or more values representing said characterized clock signal; and generating a testing clock signal in order to test the subsystem by the programmable testing clock signal generator according to programming based on said one or more values representing said characterized clock signal.

One embodiment includes characterizing the testing clock signal to determine whether or not it said matches said characterization of the clock signal. One embodiment includes modifying the programming of the programmable testing clock signal generator to generate a different test clock signal in response to determining that said characterized testing clock signal does not match said characterized clock signal. One embodiment includes varying the programming of the testing clock generator from its programming based on said one or more values representing said characterized clock signal in order to generate variants of the original clock signal for testing the subsystem. In one embodiment, said characterizing the clock signal includes sampling the clock signal at a plurality of different timing offsets. In one embodiment, said one or more values identify the signal level to be generated by the programmable testing clock signal generator at the plurality offsets.

One embodiment includes an application-specific integrated circuit (ASIC), comprising: means for characterizing a clock signal at a position within the application-specific integrated circuit (ASIC) and generating one or more values representing said characterized clock signal; and means for generating a testing clock signal based on said one or more values representing said characterized clock signal.

One embodiment includes means for characterizing the testing clock signal to determine whether or not it said matches said characterization of the clock signal. In one embodiment, said means for characterizing the clock signal includes means for sampling the clock signal at a plurality of different timing offsets. In one embodiment, said one or more values identify the signal level to be generated by said means for generating a testing clock signal at the plurality offsets.

Turning expressly to the figures, FIG. 1 illustrates an application-specific integrated circuit (ASIC) 100 according to one embodiment. As shown, ASIC 100 includes clock signal generation 102 which provides an original clock signal 103 for operation of at least a portion of ASIC 100, and may or may not be responsive to a signal external to ASIC 100.

In normal operation, clock tree/subsystem 108 operates responsive to clock signal 103 (via multiplexer 106 as clock signal 107). In one testing mode, clock signal characterization circuit 110 receives clock signal 107A, which is clock signal 107 taken from some position before or within clock tree/subsystem 108. Clock signal characterization circuit 110 is configured to sample or otherwise characterize clock signal 107A such that programmable testing clock signal generator 104 can be programmed to generate the characterized clock signal, at least within some small margin of error.

It is typically desirable to test a subsystem in an ASIC using a clock signal that closely replicates the actual clock signal that will be used in normal operation. Circuitry within an ASIC can affect the actual clock signal, such as by stretching it. Therefore, one embodiment characterizes (e.g., takes a snapshot or otherwise measures) the original clock signal 107A (i.e., 103/107/107A) during normal operation, and then based on that characterization, programmable testing clock signal generator 104 generates testing clock signal 105 which is provided as clock signal 107 for use in testing clock tree/ subsystem 108. Furthermore, in one embodiment, clock signal characterization circuit 110 can also characterize testing clock signal 105 (i.e., 105/107/107A), which allows the programming of programmable testing clock signal generator 104 to be modified until the characterization of testing clock signal 105 matches the characterization of clock signal 103. Additionally, the programming of programmable testing clock signal generator 104 can be varied from the characterized baseline clock signal for further testing using variants of the original clock signal. Note, there are many different implementations of programmable testing clock signal generator 104 that could be used in one embodiment.

In one embodiment, control system 112 is used to control clock signal characterization and generation operations via signals 111. In one embodiment, control system 112 is responsive to a system external to ASIC 100. In one embodiment, control system 112 communicates the clock signal characterization(s) to an external device. In one embodiment, control system 112 receives the clock signal characterization from clock signal characterization circuit 110 and programs programmable testing clock signal generator 104 accordingly. In one embodiment, programmable testing clock signal generator 104 receives the clock signal characterization directly from clock signal characterization circuit 110, and updates itself accordingly.

Figure 2A:
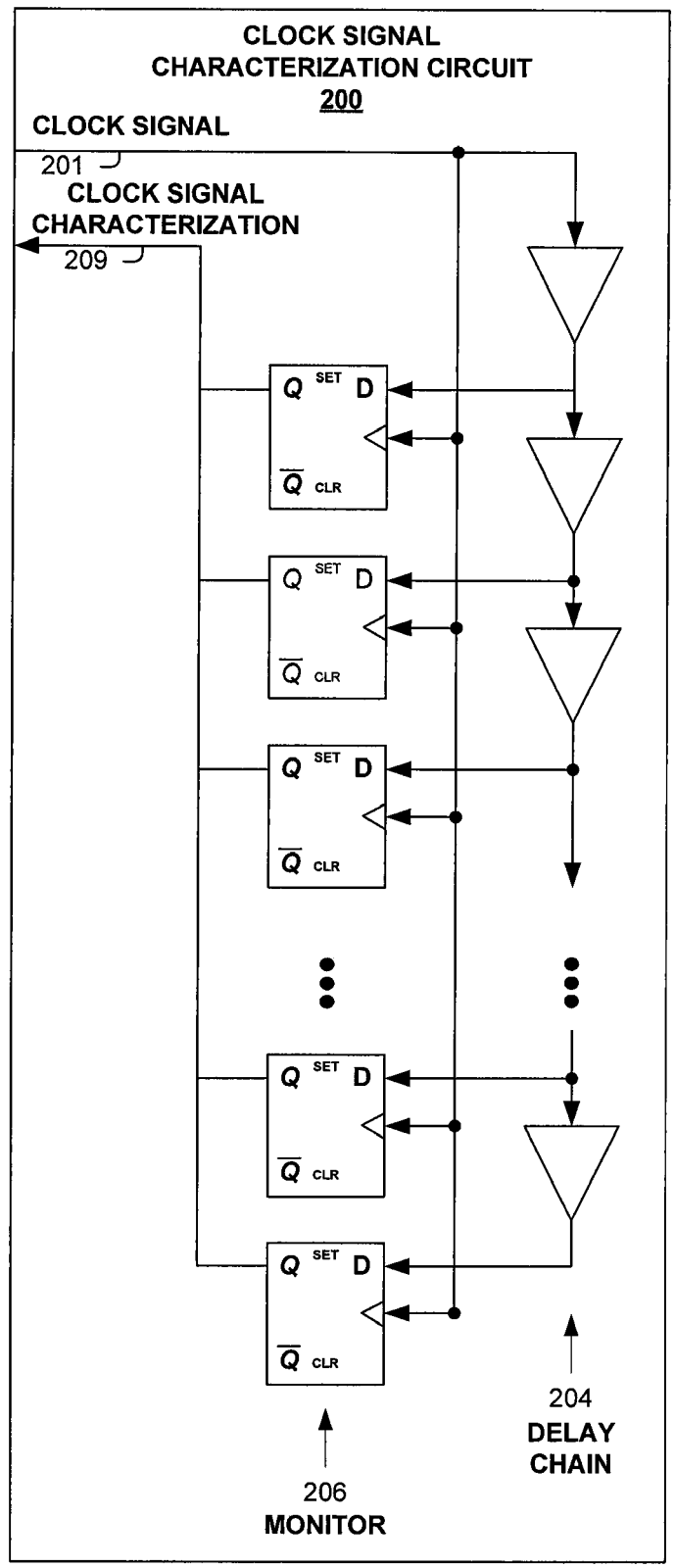
FIG. 2A illustrates a clock signal characterization circuit used one embodiment.

FIG. 2A illustrates a clock signal characterization circuit 200 used in one embodiment. As shown, clock signal characterization circuit 200 includes multiple monitor devices (e.g., D-type flip-flops) 206 and a delay chain 204. Clock signal characterization circuit 200 receives clock signal 201 which is passed through monitor devices (e.g., D-type flip-flops) 206 and a delay chain 204 (which produces the timing offsets for recording a snapshot of clock signal 201) for generating clock signal characterization 209. The operation of one embodiment is further explained in relation to FIG. 2B. Note, one embodiment uses a different implementation of monitor devices 206 and/or delay chain 204, as numerous different implementations are possible.

Figure 2B:
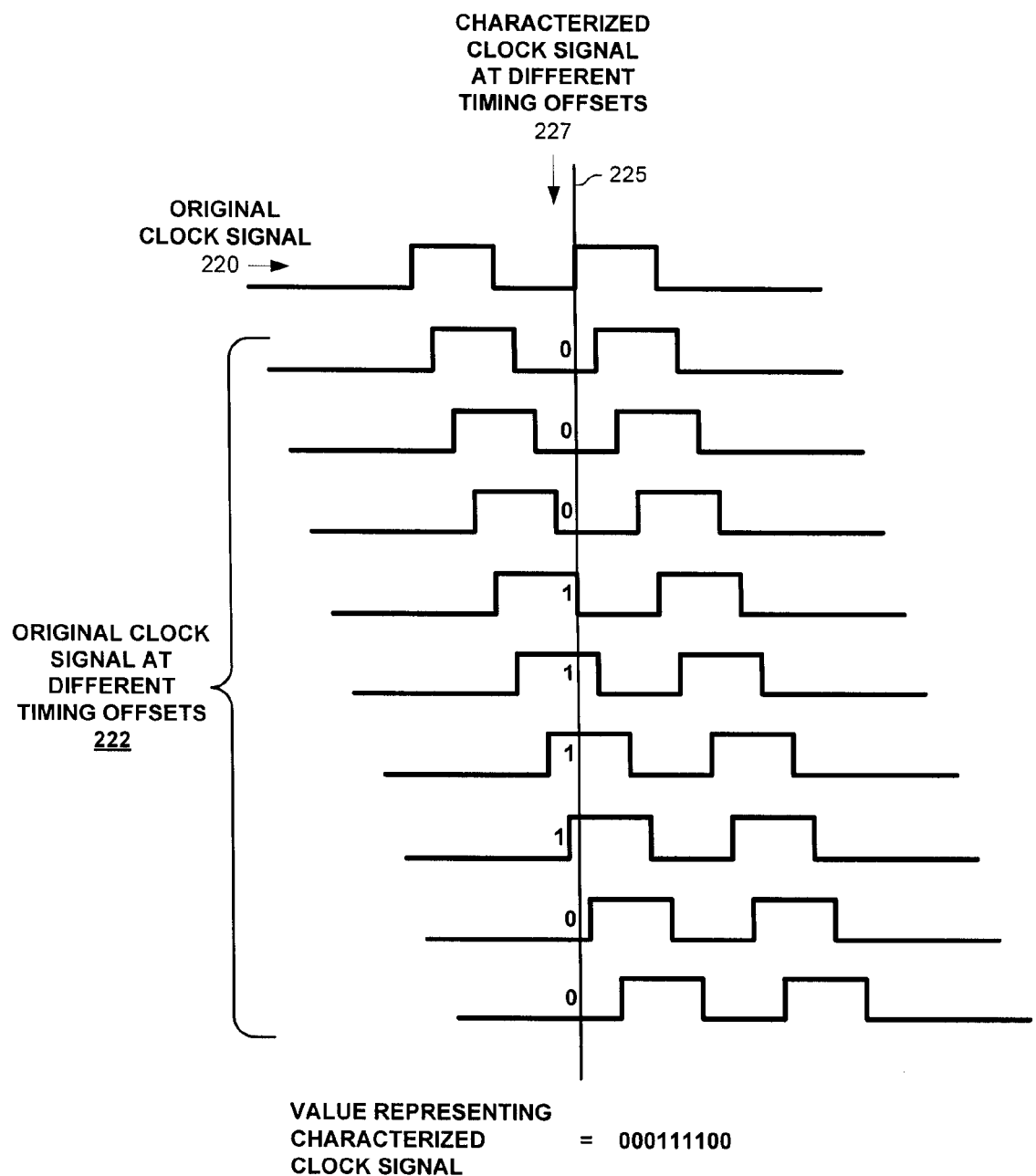
FIG. 2B illustrates the operation of a clock signal characterization circuit used one embodiment.

FIG. 2B illustrates a clock signal characterization performed in one embodiment, such as that illustrated in FIG. 2A. Original clock signal 220 and its value at different timing offsets (e.g., at different points of a delay chain) is shown. At a given time as illustrated by line 225, a snapshot value is taken at each of the different timing offsets (222), such as by, but not limited to, the latching of the value by a flip-flop. Original clock signal 220 is characterized (227) as 000111100 in this example.

Figure 3A:
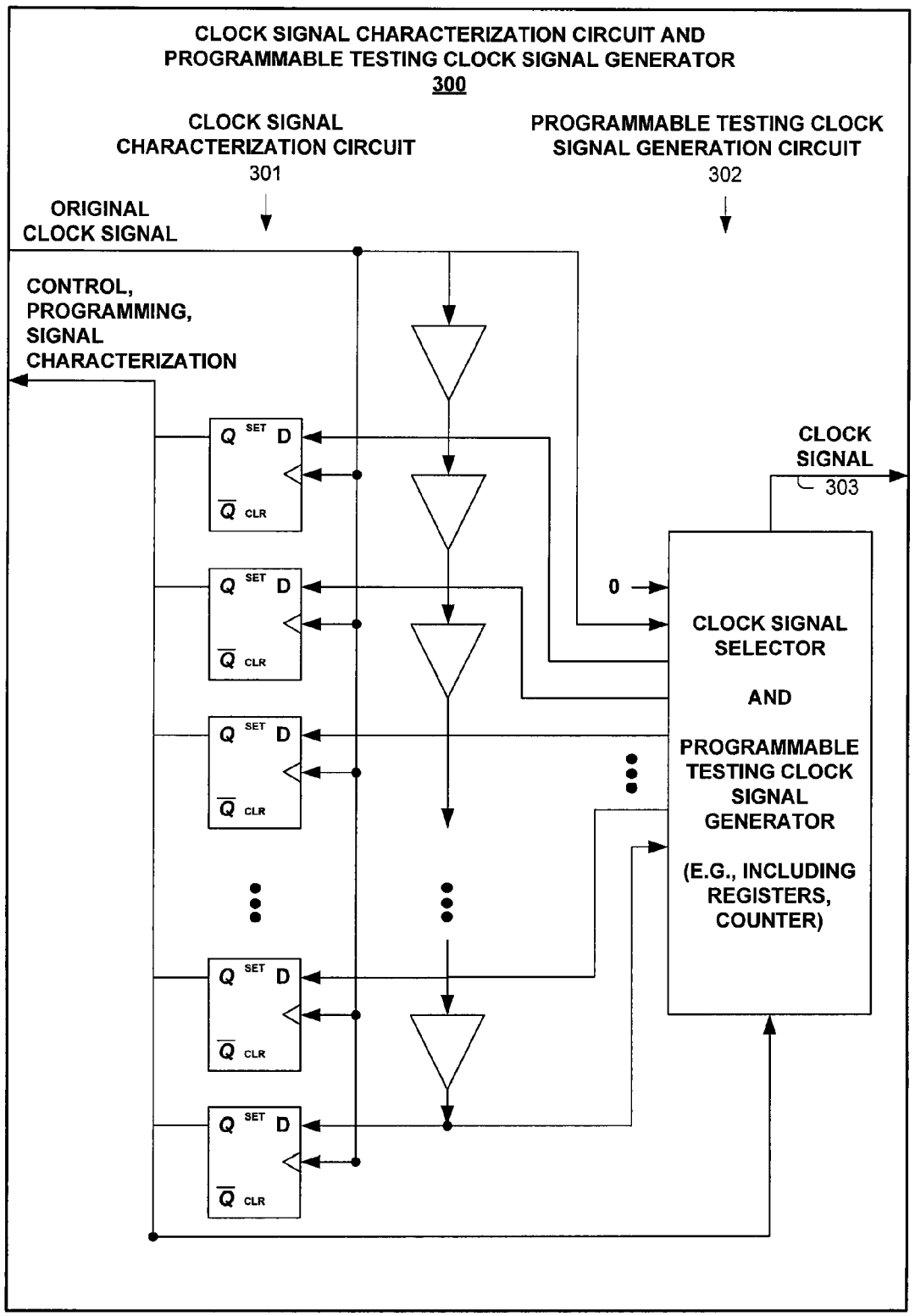
FIG. 3A illustrates a clock signal characterization circuit used one embodiment.

FIG. 3A illustrates a clock signal characterization circuit and programmable testing clock signal generator 300. This is a variant of that shown in FIG. 2A, with the addition of a programmable testing clock signal generation circuit 302 which uses the same delay chain of clock signal characterization circuit 301. As shown, clock signal characterization circuit and programmable testing clock signal generator 300 is configured to produce clock signal 303 by selecting the original clock signal or generating a testing clock signal. A programmable testing clock signal generator operative based on a clock signal through a delay chain is known in the art, and therefore will not be reproduced herein. For example, one such system is described in Jun et al., "Programmable In-Situ Delay Fault Test Clock Generator," US Patent Application Publication 2006/0242474 A1, published Oct. 26, 2006.

Figure 3B:
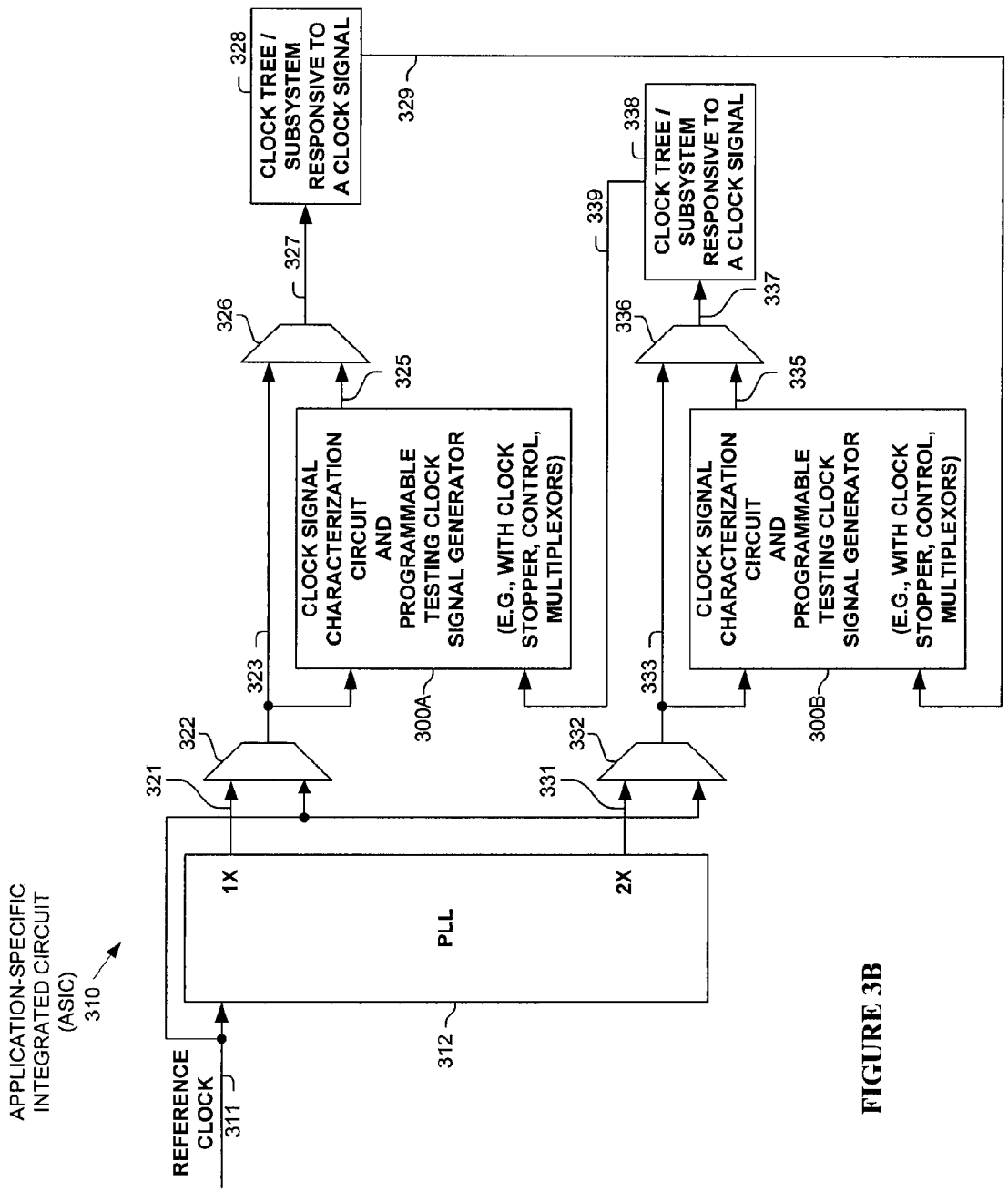
FIG. 3B illustrates a portion of an ASIC according to one embodiment.

FIG. 3B illustrates ASIC 310 according to one embodiment. ASIC 310 uses multiple clock signal characterization circuit and programmable testing clock signal generators (300A, 300B).

As shown, ASIC 310 includes a phase-locked loop (PLL) 312 for generating clock signals 321 and 331 based on reference clock signal 311. In one embodiment, PLL 312 generates clock signal 321 at the same rate as reference clock signal 311, and generates clock signal 331 at twice the rate as reference clock signal 311.

ASIC 310 also includes two clock signal characterization circuits and programmable testing clock signal generators (300A, 300B) and two clock trees/subsystems (328,338). Clock signal characterization circuit and programmable testing clock signal generator 300A is configured in one operating mode to generate a testing clock signal 325 for operating clock tree/subsystem 328; and is configured in one operating mode to characterize clocking signal 339 from clock tree/ subsystem 338. Similarly, clock signal characterization circuit and programmable testing clock signal generator 300B is configured in one operating mode to generate a testing clock signal 335 for operating clock tree/subsystem 338; and is configured in one operating mode to characterize clocking signal 329 from clock tree/subsystem 328.

Multiplexers 322, 326, 332 and 336 provide a number of different paths for clock signals and operating mode for ASIC 310.

For example, ASIC 310 can be configured such that both clock tree/subsystems 328 and 338 run based on reference clock signal 311 or a clock signal produced by PLL 312.

For example, ASIC 310 can be configured such that reference clock signal 311 is first monitored by one (or both) of elements 300A/B, and then one or both clock signals 321, 331 are monitored by one (or both) of elements 300A/B in order to calibrate a delay chain (e.g., buffer chain) within elements 300A/B.

For example, ASIC 310 can be configured to characterized PLL clock signals 321 and 331 at a position within the ASIC 310. In one operating mode, clock signal 321/323/327/329 is characterized by clock signal characterization circuit and programmable testing clock signal generator 300B and/or clock signal 321/333/337/339 is characterized by clock signal characterization circuit and programmable testing clock signal generator 300A.

For example, ASIC 310 can be configured such that clock signal 339 of clock tree/subsystem 338 (from PLL clock signal 331) is characterized by clock signal characterization circuit and programmable testing clock signal generator 300A. Clock signal characterization circuit and programmable testing clock signal generator 300B can then be programmed based on this characterization, and then caused to generate clock signal 335/337/339 which is characterized by clock signal characterization circuit and programmable testing clock signal generator 300A. Until the clock characterizations match, clock signal characterization circuit and programmable testing clock signal generator 300B can be modified. After this calibration, clock signal characterization circuit and programmable testing clock signal generator 300B can be used to test subsystem 338. Additionally, this programming can be varied to generate clocking signal variants for testing purposes (e.g., for measuring a point of failure, etc.).

In a similar example, ASIC 310 can be configured such that clock signal 329 of clock tree/subsystem 328 (from PLL clock signal 321) is characterized by clock signal characterization circuit and programmable testing clock signal generator 300B. Clock signal characterization circuit and programmable testing clock signal generator 300A can then be programmed based on this characterization, and then caused to generate clock signal 325/327/329 which is characterized by clock signal characterization circuit and programmable testing clock signal generator 300B. Until the clock characterizations match, clock signal characterization circuit and programmable testing clock signal generator 300A can be modified. After this calibration, clock signal characterization circuit and programmable testing clock signal generator 300A can be used to test subsystem 328. Additionally, this programming can be varied to generate clocking signal variants for testing purposes (e.g., for measuring a point of failure, etc.).

Figure 4:
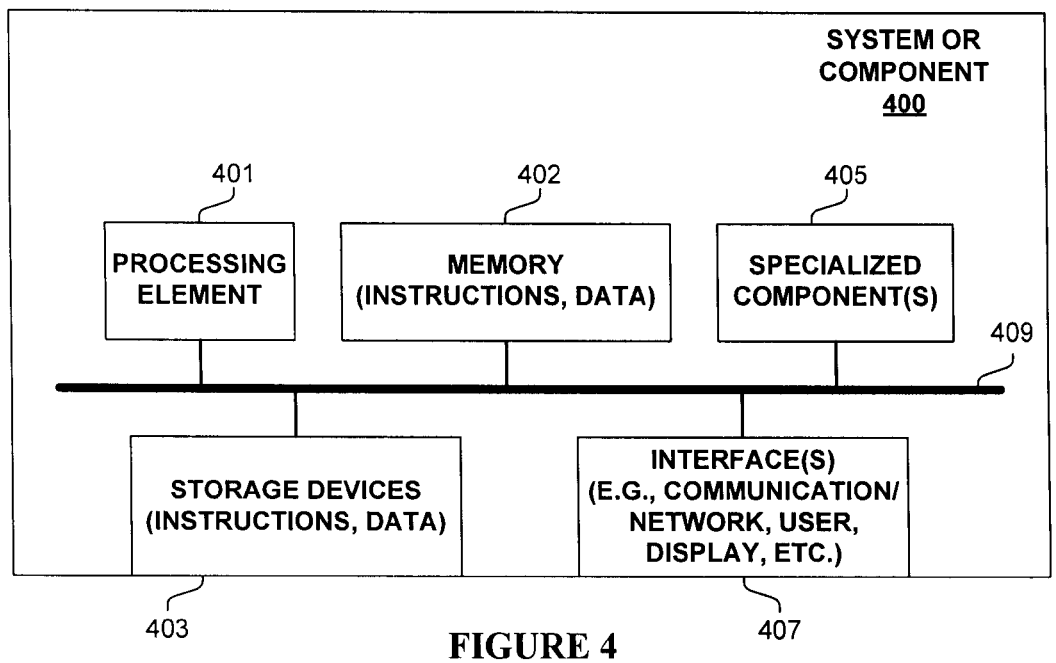
FIG. 4 illustrates an example system or component used in one embodiment.

FIG. 4 is block diagram of a system or component 400 used in one embodiment, whether performing some function on an ASIC, or interfacing (e.g., sending commands, programming, reading characterizations, etc.). In one embodiment, system or component 400 performs one or more processes corresponding to one of the flow diagrams illustrated or otherwise described herein.

In one embodiment, system or component 400 includes a processing element 401, memory 402, storage devices 403, specialized components 405 (e.g. optimized hardware such as for performing classification operations, etc.), and interface (s) 407 for communicating information (e.g., sending and receiving packets, user-interfaces, displaying information, etc.), which are typically communicatively coupled via one or more communications mechanisms 409, with the communications paths typically tailored to meet the needs of the application.

Various embodiments of component 400 may include more or less elements. The operation of component 400 is typically controlled by processing element 401 using memory 402 and storage devices 403 to perform one or more tasks or processes. Memory 402 is one type of computer-readable/computer-storage medium, and typically comprises random access memory (RAM), read only memory (ROM), flash memory, integrated circuits, and/or other memory components. Memory 402 typically stores computer-executable instructions to be executed by processing element 401 and/or data which is manipulated by processing element 401 for implementing functionality in accordance with an embodiment. Storage devices 403 are another type of computer-readable medium, and typically comprise solid state storage media, disk drives, diskettes, networked services, tape drives, and other storage devices. Storage devices 403 typically store computer-executable instructions to be executed by processing element 401 and/or data which is manipulated by processing element 401 for implementing functionality in accordance with an embodiment.

Figure 5:
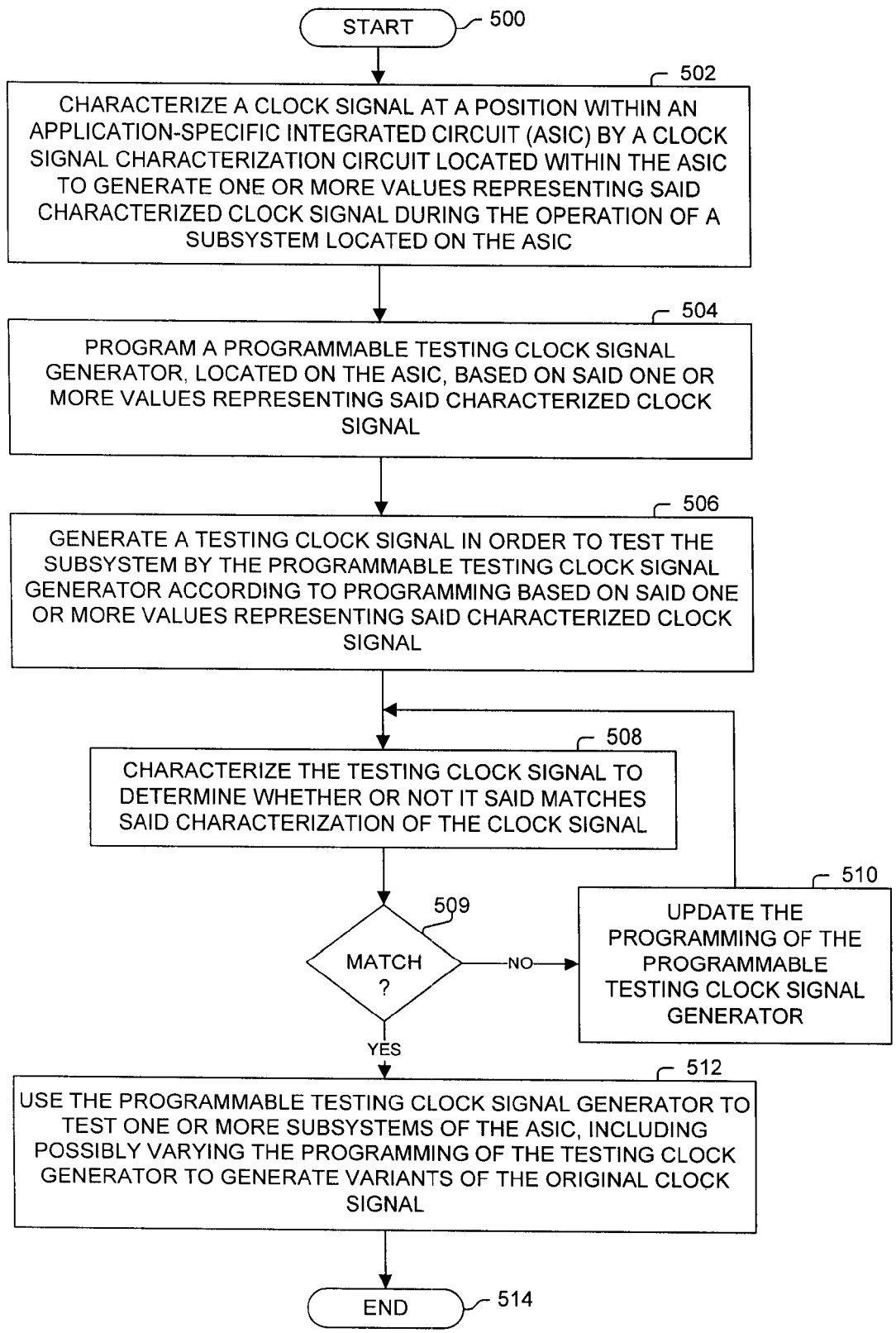
FIG. 5 illustrates a process performed in one embodiment.

FIG. 5 illustrates a process used in one embodiment. Processing begins with process block 500. In process block 502, a clock signal at a position within an application-specific integrated circuit (ASIC) is characterized by a clock signal characterization circuit located within the ASIC to generate one or more values representing said characterized clock signal during the operation of a subsystem located on the ASIC. In process block 504, a programmable testing clock signal generator, located on the ASIC, is programmed based on said one or more values representing said characterized clock signal. In process block 506, a testing clock signal is generated in order to test the subsystem by the programmable testing clock signal generator according to programming based on said one or more values representing said characterized clock signal. In process block 508, the testing clock signal is characterized to determine whether or not it said matches said characterization of the clock signal. As determined in process block 509, if the characterizations do not match, then in process block 510, the programming of the programmable testing clock signal generator is updated; and processing returns to process block 508. Otherwise, in process block 512, the programmable testing clock signal generator is used to test one or more subsystems of the ASIC, which possibly may include varying the programming of the programmable testing clock signal generator to generate variants of the original clock signal. Processing of the flow diagram of FIG. 5 is complete as indicated by process block 514.

In view of the many possible embodiments to which the principles of our invention may be applied, it will be appreciated that the embodiments and aspects thereof described herein with respect to the drawings/figures are only illustrative and should not be taken as limiting the scope of the invention. For example, and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An application-specific integrated circuit (ASIC), comprising:
   a clock signal characterization circuit configured to characterize a clock signal within the ASIC; and
   a programmable testing clock signal generator configured for being programmed based on said characterization of the clock signal, and for generating a test clock signal based on its said programming; and
   a subsystem configured to be selectively responsive to: (a) the clock signal, and (b) the test clock signal;
   wherein the clock signal characterization circuit is configured to characterize the clock signal during operation of the subsystem responsive to the clock signal; and
   wherein the programmable testing clock signal generator is configured to generate the test clock signal for testing the subsystem responsive to the test clock signal instead of the clock signal.

2. The ASIC of claim 1, wherein the clock signal characterization circuit is configured to characterize the test clock signal.

3. The ASIC of claim 2, wherein said programming of the programmable testing clock signal generator is configured to be modified in response to said characterization of the test clock signal differing from said characterization of the clock signal.

4. The ASIC of claim 2, wherein said characterization of the test clock signal matches said characterization of the clock signal.

5. The ASIC of claim 1, wherein the clock signal characterization circuit includes a plurality of devices configured to sample one or more input clock signals at different timing offsets, wherein said one or more input clock signals include the clock signal.

6. The ASIC of claim 5, wherein said one or more input clock signals include the test clock signal.

7. The ASIC of claim 5, wherein each of the plurality of devices is configured to recognize a low or a high signal value of one of said input clock signals; and wherein the programmable testing clock signal generator is said configured to be programmed with said low or high signal values recognized by the plurality of devices.

8. The ASIC of claim 5, including a delay chain for generating signals at said different timing offsets; and wherein the plurality of devices are configured to be responsive to said generated signals at said different timing offsets.

9. The ASIC of claim 8, wherein the programmable testing clock signal generator is configured to be responsive to said generated signals at said different timing offsets for said generation of the test clock signal based on its said programming.

10. A method, comprising:
characterizing a clock signal at a position within an application-specific integrated circuit (ASIC) by a clock signal characterization circuit located within the ASIC to generate one or more values representing said characterized clock signal during the operation of a subsystem, located on the ASIC, responsive to the clock signal;
programming a programmable testing clock signal generator, located on the ASIC, based on said one or more values representing said characterized clock signal; and
generating a testing clock signal in order to test the subsystem by the programmable testing clock signal generator according to programming based on said one or more values representing said characterized clock signal, with the subsystem being responsive to the test clock signal.

11. The method of claim 10, comprising characterizing the testing clock signal to determine whether or not it said matches said characterization of the clock signal.

12. The method of claim 10, including modifying the programming of the programmable testing clock signal generator to generate a different test clock signal in response to determining that said characterized testing clock signal does not match said characterized clock signal.

13. The method of claim 10, comprising varying the programming of the testing clock generator from its programming based on said one or more values representing said characterized clock signal in order to generate variants of the original clock signal for testing the subsystem.

14. The method of claim 10, wherein said characterizing the clock signal includes sampling the clock signal at a plurality of different timing offsets.

15. The method of claim 14, wherein said one or more values identify the signal level to be generated by the programmable testing clock signal generator at the plurality offsets.

16. An application-specific integrated circuit (ASIC), comprising:
means for characterizing a clock signal, and for generating one or more values representing said characterized clock signal, at a position within the ASIC during operation of a subsystem within the ASIC, with the subsystem being responsive to the clock signal during said characterization; and
means for generating a testing clock signal based on said one or more values representing said characterized clock signal in order to test the subsystem operable to the testing clock signal instead of the clock signal.

17. The apparatus of claim 16, comprising means for characterizing the testing clock signal to determine whether or not it said matches said characterization of the clock signal.

18. The apparatus of claim 16, wherein said means for characterizing the clock signal includes means for sampling the clock signal at a plurality of different timing offsets.

19. The apparatus of claim 18, wherein said one or more values identify the signal level to be generated by said means for generating a testing clock signal at the plurality offsets.

* * * * *